United States Patent [19]
Mizutani et al.

[11] Patent Number: 5,985,358
[45] Date of Patent: *Nov. 16, 1999

[54] HIGH-SPEED METHOD FOR MANUFACTURING AN ELECTROLUMINESCENT DEVICE USING DEHYDRATED TRANSPORT GAS AND APPARATUS THEREFOR

[75] Inventors: Atsushi Mizutani, Anjou; Masayuki Katayama, Handa; Nobuei Ito, Chiryu; Tadashi Hattori, Okazaki, all of Japan

[73] Assignee: Nippondenso Co., Ltd., Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/845,842

[22] Filed: Apr. 28, 1997

Related U.S. Application Data

[63] Continuation of application No. 08/493,997, Jun. 23, 1995, abandoned.

[30] Foreign Application Priority Data

Jun. 24, 1994 [JP] Japan ................................... 6-166422

[51] Int. Cl.$^6$ ................................ B05D 5/06; C23C 16/00
[52] U.S. Cl. ...................... 427/66; 427/69; 427/255.15; 427/255.28
[58] Field of Search ........................... 428/690; 313/504; 427/66, 69, 255.1, 255.2, 255.3, 255.7, 255.15, 255.28

[56] References Cited

U.S. PATENT DOCUMENTS

| | | | |
|---|---|---|---|
| 4,981,712 | 1/1991 | Yamamoto et al. | 427/38 |
| 5,087,531 | 2/1992 | Terada et al. | 428/690 |
| 5,147,683 | 9/1992 | Tanaka . | |
| 5,185,181 | 2/1993 | Mikami . | |
| 5,275,840 | 1/1994 | Mikami . | |
| 5,372,839 | 12/1994 | Mikami . | |
| 5,372,851 | 12/1994 | Ogawa et al. | 427/255.7 |
| 5,505,986 | 4/1996 | Velthaus et al. | 427/66 |

FOREIGN PATENT DOCUMENTS 60-88425  5/1985  Japan .

OTHER PUBLICATIONS

Pierson, "Handbook of chemical Vapor Deposition(CVD)", p. 87, 1992.

Pierson, "Handbook of Chemical Vapor Deposition (CVD)", No Month Available 1992, p. 87.

Barrow et al: "A New Class of Blue TFEL Phosphors with Application to a VGA Full–Color Display", SID 93 digest—pp. 761–764 No Month Available.

Leskela, et al: "Growth of Srs Thin Films by Atomic Layer Epitaxy" Mat.Res.Soc.Symp.Proceedings, vol. 222, No Month Available 1991.

Millipore, ED9112, Nov. 1991, pp. 1–23—Abstract.

*Primary Examiner*—Brian K. Talbot
*Attorney, Agent, or Firm*—Pillsbury Madison & Sutro LLP

[57] ABSTRACT

A method and apparatus for manufacturing EL devices in a short period of time wherein during formation of a light emitting layer composed of II, III or VI-group of elements doped with a light emitting element through a chemical vapor deposition method, water content of a transport gas that transports gasified organic metals is removed through a dehydration filter and thus, source material decomposition due to the water content is prevented and a steady supply of source materials becomes possible. By removing the water content of the transport gas, source materials can be supplied constantly even if heating temperatures exceed a temperature conventionally regarded as the temperature at which decomposition starts and thus, a light emitting layer having a practical thickness can be formed in a short period of time. Because of the high-speed film formation, the rate of the film being contaminated with impurities lessens and the light emitting layer has a luminance three times that of conventional layers.

14 Claims, 2 Drawing Sheets

HIGH-SPEED METHOD FOR MANUFACTURING AN ELECTROLUMINESCENT DEVICE USING DEHYDRATED TRANSPORT GAS AND APPARATUS THEREFOR

This is a continuation of application Ser. No. 08/493,997, filed Jun. 23, 1995 now abandoned.

CROSS-REFERENCE TO RELATED APPLICATION

This application is related to and claims priority from Japanese Patent Application No. Hei-6-166422, the contents of which are hereby incorporated by reference.

BACKGROUND OF THE INVENTION

1. Field of the Invention

The invention concerns an electroluminescent device (hereinafter referred to as an EL device) used, for example, in light emitting-type segment and matrix displays of meters or in displays of various types of computer terminals.

2. Description of Related Art

In the past, EL devices that utilize the phenomenon of light emission when electric fields are applied to fluorescent materials like zinc sulfide (ZnS) have been widely noted as a component for light emitting-type, flat panel displays. FIG. 3 is a diagram that shows a cross-sectional structure of a conventional EL device 10. The EL device 10 is formed by sequentially laminating on top of an insulating glass base 1 a first electrode 2 made up of an optically transparent ITO film, a primary insulating layer 3 made up of tantalum pentoxide ($Ta_2O_5$) or the like, a light emitting layer 4, a second insulating layer 5 and a second electrode layer 6 made up of ITO film.

The ITO films 2,6 are transparent conductive films made by doping indium oxide ($In_2O_3$) with tin (Sn). This composition has been widely used as in the past as a transparent electrode because of its low electrical resistance. The light from light emitting layer 4 varies with, for example, the type of additive added to the zinc sulfide (ZnS) used therein. For example, a yellowish-green colored light is emitted if terbium (Tb) is added as a light emitting center, a reddish-orange light when samarium (Sm) is added, a bluish light when thulium (Tm) is added and a bluish-green colored light is emitted if cerium (Ce) is added to strontium sulfide (SrS) as the light emitting center.

For the EL device 10 having the above structure, the use of zinc sulfide (ZnS) or zinc selenide (ZnSe) added to terbium (Tb), or equivalently, other sulfur or selenium compounds as the component material of a light emitting layer 4 for increasing the brightness of light emissions using electronic beam (EB) deposition, sputtering or the like has been investigated. In recent times, investigations using CVD (Chemical Vapor Deposition) have also been performed.

Examples of the CVD method include those based on halogen element gas transportation and those that vaporize halide compounds at high temperatures and transport them to the reaction chamber or the like. However, for the methods described above, because of high vaporization temperatures, difficulties in controlling vapor amounts and likely changes in the ratio of II and VIB-group gases supplied to the reaction chamber with the material of the light emitting center, light emitting layers of high quality cannot be developed consistently.

The Metalorganic Chemical Vapor Deposition (MOCVD) method that uses organic metals, e.g. dipivaloylmethanate compounds, has been gaining notice as a solution to this problem. In general, the MOCVD method follows a methodology wherein an organic metal in liquid form is bubbled with hydrogen ($H_2$) to contain the organic metal inside the hydrogen and then supplied to the reaction chamber. However, rare earth elements and organic metals of the alkaline earth metal elements are generally fine solid particles at normal temperatures and have melting points of 150° C. and above. Accordingly, the supply method for the source gas material employs a technique wherein a source material container filled with rare earth elements and organic metals of the alkaline earth metal elements is first heated in a heating oven, after which a transport gas (carrier gas), e.g., $H_2$ or the like is introduced and then vaporized organic metal contained inside the hydrogen ($H_2$) is transported to the reaction chamber.

However, if the organic metal is solid, then decomposition or the like of the source material due to the heat occurs and thus, large amounts of source material gas cannot be obtained because of sublimation. Accordingly, as was noted in the 1991 MRS Symposium Proceedings Vol. 222 pp. 315–322, when a solid organic metal is used as a source material during the formation of the host substance of the light emitting layer, it has been reported that if the temperature applied to the source material surpasses a certain level, the source material begins to decompose, its characteristics change and thus, the speed of the formation of the light emitting layer is said to vary widely. In addition, the speed of the formation of the light emitting layer is a problem because, as calculated in the above paper, a long period of time unsuitable for production is needed to form a film of the light emitting layer which has a practical thickness. Accordingly, even if the source material is heated to derive large amounts of sublimated gas of the organic metal that is the source material, only very small amounts of source material can be derived because source materials decompose even before a practical amount of gas can be obtained, and thus, achieving practical film formation speed is not possible.

SUMMARY OF THE INVENTION

In consideration of the above problems, this invention intends to provide an apparatus and a method for manufacturing EL devices in a short period of time.

To achieve these aims, a first aspect of the present invention provides a method for manufacturing EL devices whose main characteristics are: that it is a method for manufacturing an electroluminescent device at least a side of which is composed of an optically transparent material; that at least one type of gas from the II or IIIB group of source gas material that will become the host material of a light emitting layer reacts inside a reaction chamber with a gas from the VIB group of source gas materials; furthermore, that during the formation of the light emitting layer formed by adding a light emitting center to the host substance using the chemical vapor deposition method, transport gas for transporting the source material to the reaction chamber is dehydrated gas; and that dehydrated gas is used in transporting the source material to the reaction chamber. Also, another aspect of the present invention is that the dehydrated gas is transport gas having a water content of 100 ppb or below, or transport gas having a dew point between −120° C. and −90° C. inclusive.

In this way, during the formation of a light emitting layer made up of at least two types of elements from the II, IIIB or VIB-group of elements and an element of the light emitting center through the chemical vapor deposition method, removal of the water contained inside the transport gas that transports gasified organic metal to a reaction chamber prevents source material decomposition due to the water content and thus, constant supply of the source material becomes possible.

Also, a further aspect of the prevent invention is that a dehydrating device for dehydrating the transport gas is disposed at a point upstream of a container containing the source material.

Accordingly, the removal of the water content of the transport gas that transports the source material to the reaction chamber enables the continuous supply of the source material even if temperatures reach the temperature that has been reported in the past as the point where the source material begins to decompose, and even if the source material is heated at temperatures beyond this point, no decomposition occurs and thus, a light emitting layer having a film of practical thickness can be produced in a short period of time. As a result, because of the faster speed at which the film is formed, there is a lower probability of impurities to be mixed in, the properties of the light emitting layer are improved and the luminance of the light emitting layer is more than three times that of a conventional light emitting layer.

Furthermore, one further aspect of this invention is that the transport gas is an inert gas, hydrogen ($H_2$) or nitrogen ($N_2$) or that the source materials to strontium (Sr), calcium (Ca), barium (Ba) or zinc (Zn) are one or more different compounds which consist of the relevant II-group element and organic molecules coordinated to it as a ligand. Moreover, another aspect of this invention is that the source materials to gallium (Ga), indium (In) or aluminum (Al) are one or more different compounds which consist of the relevant IIIB-group element and organic molecules coordinated to it as a ligand. In particular, a yet further aspect of this invention is that a temperature applied to the source material is between 230° C. and 255° C. exclusive when the II-group source materials are organic compounds made by adding organic ligands to any one of the following: strontium (Sr), calcium (Ca) or barium (Ba).

Moreover, to achieve the aims stated above, the main points of yet another aspect of the present invention provides an apparatus for manufacturing electroluminescent devices whose main characteristics are: that it is an apparatus for manufacturing an electroluminescent device that has at least one side formed with an optically transparent material; that at least one type of gas from the II or III-group that will become the host substance of a light emitting layer reacts inside a reaction chamber with a gas from the VI-group; and that during the formation of the light emitting layer formed by adding a light emitting center to the host material through the chemical vapor deposition method, there is a dehydration device that removes water contained inside the transport gas that transports source materials to a reaction chamber.

BRIEF DESCRIPTION OF THE DRAWINGS

Additional objects and advantages of the present invention will be more readily apparent from the following detailed description of the preferred embodiments thereof when taken together with the accompanying drawings in which.

DETAILED DESCRIPTION OF THE PRESENTLY PREFERRED EXEMPLARY EMBODIMENTS

The embodiments of this invention are explained below with the use of related figures.

Figure 2:
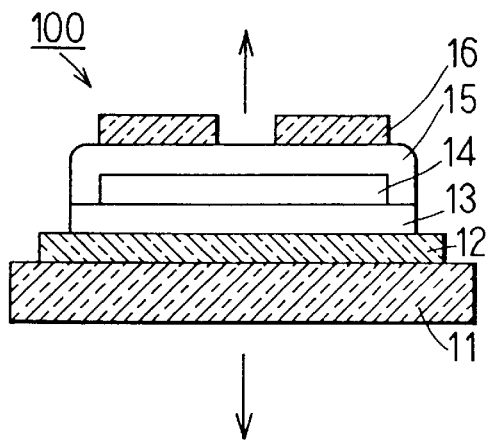
FIG. 2 is a schematic diagram of a cross-section of the EL device of this embodiment.
Figure 3:
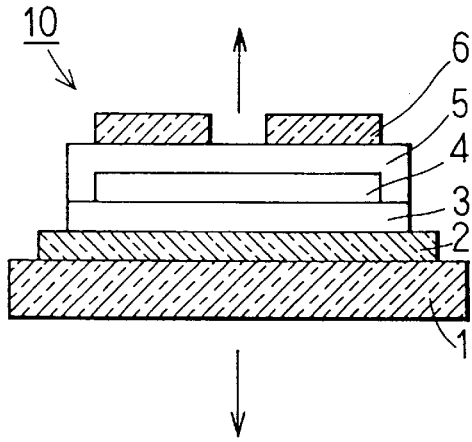
FIG. 3 is a schematic diagram of a cross-section of a conventional EL device.

FIG. 2 shows a cross-section of an EL device 100 according to a preferred embodiment of this invention. The thin film EL device 100 of FIG. 2 emits light in the directions of the arrows. The thin film EL device 100 is formed by sequentially laminating the following layers on top of a glass base 11 that is the insulating base: a transparent first electrode 12 composed of optically transparent zinc oxide (ZnO), a first insulating layer 13 composed of optically transparent tantalum pentoxide ($Ta_2O_5$), a light emitting layer 14 formed by adding a light-emitting center cerium (Ce) to strontium sulfide (SrS), a second insulating layer 15 composed of optically transparent tantalum pentoxide ($Ta_2O_5$), and a transparent second electrode 16 composed of optically transparent zinc oxide (ZnO). It must be noted that the thickness of the films are based on measurements of their central parts.

Figure 4:
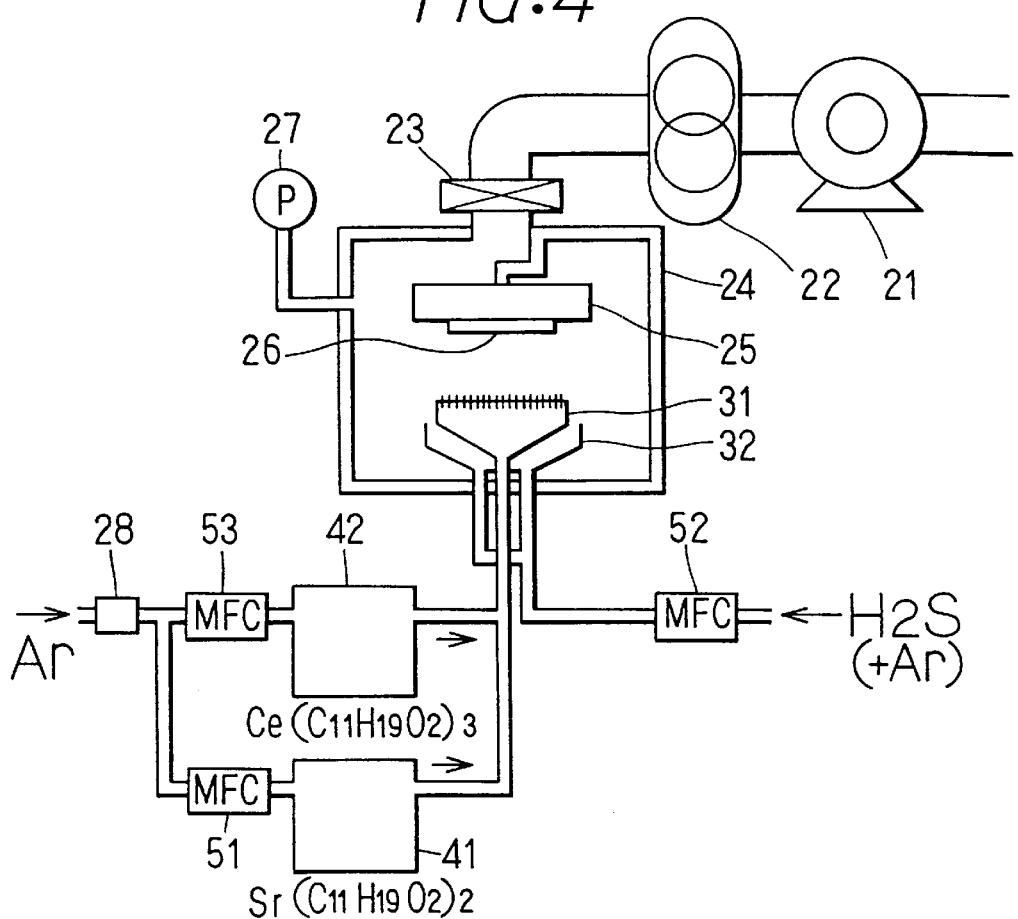
FIG. 4 is a schematic diagram of a metalorganic chemical vapor deposition apparatus used in forming the light emitting layer of the EL device of the above-described embodiment of this invention.

As the apparatus for forming the EL device 100, in particular, a light emitting layer-forming MOCVD apparatus is shown in FIG. 4. The function and construction of this MOCVD apparatus are basically the same as that of a common MOCVD apparatus. However, as shown in FIG. 4, this apparatus for forming the light emitting layer of the EL device is provided with a passage for the transport gas (argon (Ar) in this case) at the upstream side of a container 41 of bisdipivaloylmethanate strontium ($Sr(C_{11}H_{19}O_2)_2$) which is the source material that forms the host of the light emitting layer and a container 42 of tridipivaloylmethanate cerium ($Ce(C_{11}H_{19}O_2)_3$). At the same time, the device is provided with a dehydration filter 28 such as a Millipore WPMV 200 SI as a dehydration device 28. It must be noted that gas flow controllers 51, 52, 53 (mass flow controllers or MFCs) are provided at passages for introducing source materials. The MOCVD apparatus is constructed in such a way that process gas is supplied from a front side of the glass layer 26 and the process gas (transport gas) after reaction is discharged from rear parts of the substrate 26 through exhaust pumps 22, 21.

As noted above, bisdipivaloylmethanate strontium is preferably used as the source material gas; however, other Group II organometallic compounds such as bisdipivaloylmethanate calcium or bisdipivaloylmethanate barium may also be used, as well as cyclopentadienyl methylstrontium, cyclopentadienyl methylcalcium, cyclopentadienyl methylbarium, cyclopentadienyl methylstrontium tetrahydrofuran additive, cyclopentadienyl methylcalcium tetrahydrofuran additive or cyclopentadienyl methylbarium tetrahydrofuran additive.

Also, about the arrangement inside an actual apparatus of nozzles shown in FIG. 4, nozzle 31 which supplies strontium source material is placed at the center with its height slightly higher than nozzle 32 which supplies sulfide (S) (or another VIB group compound) source material. In addition, nozzle 32 for supplying sulfide source material is so disposed that it surrounds the periphery of nozzle 31. Furthermore, the film formation efficiency rate is high in reference to the amount of source material supplied and high-speed film formation is possible if nozzle 31 which supplies strontium source material is placed near the glass substrate 26. However, in this case, if the nozzle 31 for supplying strontium source material is too close to the glass substrate 26, there is a possibility that heat applied to the glass substrate 26 would decompose the strontium source material that is inside the nozzle 31. Therefore, although it should change in response to heating temperatures of the glass substrate 26 and to pressure inside the reaction chamber during the strontium sulfide (SrS) film formation, the clearance between the nozzle 31 for supplying the strontium source material 31 and the glass substrate 26 should be set approximately between 50 mm and 150 mm for the above-described arrangement. In addition, the substrate 26 on which the film is formed is fixed to a susceptor 25 that has a heater and its temperature is controlled through feedback controls using a thermocouple. Furthermore, the internal pressure of the reaction chamber is monitored using a pressure gauge 27.

The manufacturing process of the thin-film EL device 100 using the apparatus described above is explained below.

(a) First, a first transparent electrode 12 is formed on top of the glass substrate 11. A pellet-formed mixture made by adding and mixing gallium oxide ($Ga_2O_3$) and zinc oxide (ZnO) powder is used as a deposition material while an ion plating apparatus is used as the film formation apparatus. Air is evacuated from the interior of the ion plating apparatus so that it becomes a vacuum while keeping the temperature of the substrate 11 described above constant. Afterwards, argon (Ar) gas is introduced, the pressure is kept at a constant level while adjusting beam power and high-frequency power so that film formation speed lies in the range of 6~18 nm/min.

(b) Next, on top of the transparent first electrode 12, the first insulating layer 13 composed of tantalum pentoxide ($Ta_2O_5$) is formed using the sputtering method. While keeping the temperature of the substrate 11 constant, the gas mixture of argon (Ar) with oxygen ($O_2$) is introduced to the interior of the sputtering device and film formation is performed at a high-frequency power of 1 kW.

(c) On top of the first insulating layer 13, a SrS:Ce light emitting layer 14 that has cerium as the light emitting center added to strontium sulfide (SrS) as the host material is formed using the MOCVD apparatus shown in FIG. 4.

(d) While keeping the temperature of the substrate 11 at 400° C., pressure inside the film formation chamber is adjusted to give a low-pressure atmosphere of 1.0 Torr through the use of pressure adjusters not shown in FIG. 4. Since the sublimation temperature of the strontium source material is much lower and the controllability of its temperature much superior to that of chlorides and fluorides, bisdipivaloylmethanate strontium ($Sr(C_{11}H_{19}O_2)_2$) (or another suitable Group II organometallic compound as noted above) is used as the source material and the container 41 filled with it is kept at temperatures between 210~260° C. at precisions within ±1° C.

(e) Argon gas (Ar) that has been used in transporting bisdipivaloylmethanate strontium ($Sr(C_{11}H_{19}O_2)_2$) to the reaction chamber is passed through the dehydration filter 28 to remove its water content before it is introduced to the interior of the source material container 41 and is dehydrated so that its water content is below 1 ppb (corresponding to a dew point of −112° C.). It must be noted that even if the water content of the argon (Ar) gas during this time is 100 ppb or below (corresponding to a dew point of −90° C. or below), thus possibly causing the temperature for the start of the decomposition of bisdipivaloylmethanate strontium (Sr ($C_{11}H_{19}O_2)_2$) to be lowered by a few degrees, it will still be within allowable limits since it does not represent any hindrance in the actual, high-speed formation of the film of the light emitting layer. Moreover, since the objective is to remove the water content of the transport gas that transports the bisdipivaloylmethanate strontium ($Sr(C_{11}H_{19}O_2)_2$) and tridipivaloylmethanate cerium ($Ce(C_{11}H_{19}O_2)_3$) source materials that easily decompose through water to the interior of the reaction chamber 24, the installation position of the dehydration filter 28 should be at an upstream of these source materials.

(f) The thin film of strontium sulfide (SrS) is formed by introducing bisdipivaloylmethanate strontium (Sr ($C_{11}H_{19}O_2)_2$) to the interior of the reaction chamber 24 through the use of argon (Ar) that has passed through the dehydration filter 28 while at the same time allowing a predetermined amount of hydrogen sulfide ($H_2S$) that has been diluted by argon (Ar) to flow. As the VIB-group source material supplying sulfur (S), it can be the material that has added an organic material to sulfur (S) and it is desirable that the transport gas which is argon (Ar) gas is passed beforehand through the dehydration filter 28.

(g) At the same time, the source material of the light emitting center which is tridipivaloylmethanate cerium (Ce ($C_{11}H_{19}O_2)_3$) fills the container 42 and the temperature of this container 42 is kept constant at 105° C. The sublimated source gas material during this time is transported to the reaction chamber 24 using argon (Ar) gas. Also for this (Ar) argon gas to be used in transporting the light emitting center, passing it through the dehydration filter 28 would reduce its water content to below 1 ppb.

(h) Next, using diethylzinc ($Zn(C_2H_5)_2$) (or dimethyl zinc) and hydrogen sulfide ($H_2S$), the zinc sulfide thin film of 100 nm thickness is formed and by combining this with strontium sulfide doped with cerium, the light emitting layer 14 is formed.

(i) The second insulating layer 15 made from ditantalum pentoxide ($Ta_2O_5$) is formed on top of the light emitting layer 14 using the same method used in forming the first insulating layer 13. Then, a transparent second electrode 16 made from zinc oxide (ZnO) film is formed on top of the second insulating layer 15 using the same method used in forming the transparent first electrode 12.

As for the thickness of the films of each of the layers, the transparent first 12 and second electrodes 16 are each 300 nm thick, the first insulating and second insulating layers are each 400 nm thick and the light emitting layer 14 consisting of 100 nm of zinc sulfide (ZnS) and 700 nm of SrS:Ce is 800 nm thick.

Figure 1:
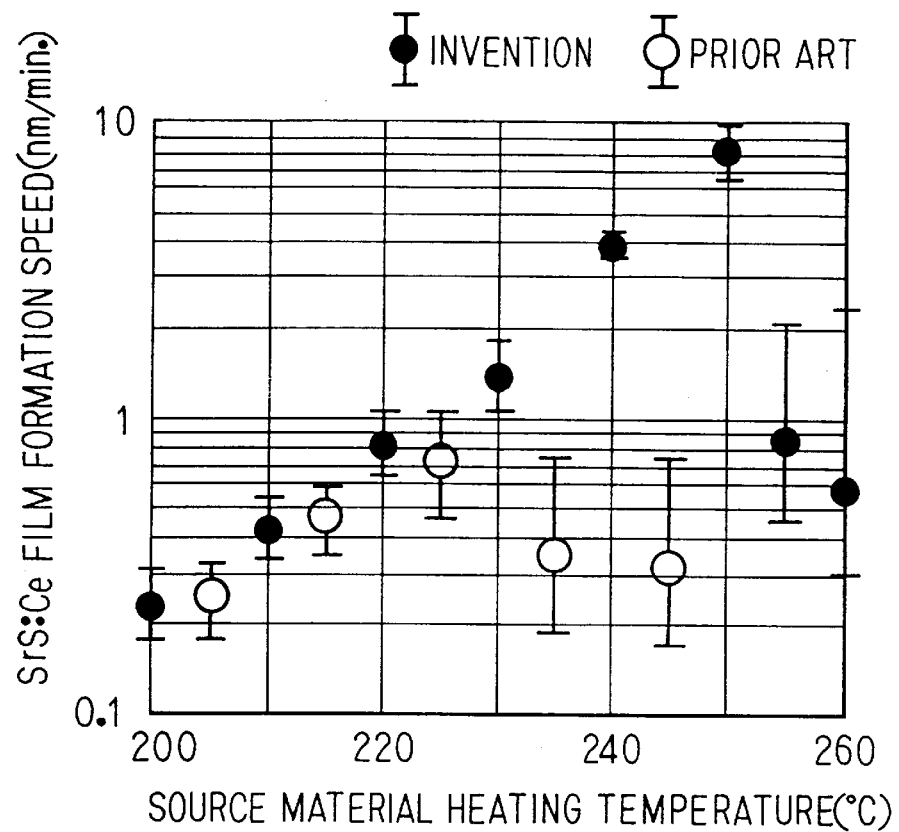
FIG. 1 is a diagram showing the relationship of the speed of the formation of a light emitting layer of an EL device according to a first embodiment of the present invention with temperature applied to a source material.

FIG. 1 shows the relationship between the speed of the film formation of SrS:Ce using the method described above and the heating temperature of the strontium source material bisdipivaloylmethanate strontium ($Sr(C_{11}H_{19}O_2)_2$) during its gasification. The black circle ● in FIG. 1 is the average film formation speed of SrS:Ce for the embodiment of the present invention plotted against the heating temperature of the source material while the white circle ○ is the average film formation speed of SrS:Ce plotted against the heating temperature of the source material for the conventional method (no dehydration filtering). In addition, the line that marks the upper limit shows the largest value in the range of experimentally-observed values of the film formation speed described above, while the lower line shows the smallest such value.

As shown in FIG. 1, for the conventional case (marked with the white circle ○) wherein non-dehydrated argon (Ar) gas is used, if the applied heating temperature to the strontium source material exceeds 230° C., the supply of the source material becomes unstable and the film formation speed of strontium sulfide (SrS) varies widely. However, it must be noted that the conventional method shown in FIG. 1 used argon (Ar) gas that was not dehydrated using the dehydration filter in performing the film formation in the same way as in this embodiment and that the dew point of the argon (Ar) gas was actually approximately −65° C. In other words, it can be said that the argon (Ar) gas for this case contained a considerable amount of water.

When argon (Ar) gas that has a dew point of −90° C. is used as the process gas (transport gas), the characteristics become better, as compared to those of the conventional method described above, with the decomposition of the bisdipivaloylmethanate strontium ($Sr(C_{11}H_{19}O_2)_2$) starting at a temperature greatly exceeding 250° C. with occurrences of dispersion in the thin film formation of the strontium sulfide (SrS).

According to this invention, as shown in FIG. 1, the formation speed increases logarithmically with the heating temperature of strontium source material up to a temperature of 250° C.; however, if the heating temperature exceeds 250° C., for example, at 255° C., the film formation speed of the strontium sulfide (SrS) slows down because of deterioration due to decomposition of the source material. The actual thin-film formation speed of strontium sulfide is 8 nm/min on the average when the temperature applied to strontium source material which is bisdipivaloylmethanate strontium ($Sr(C_{11}H_{19}O_2)_2$) is 250° C. and thus, it will take less than 1.5 hours to form a 700 nm thick strontium sulfide (SrS) light emitting layer which represents a significant reduction over the conventional method, and analyzing for the impurity content of the thin film, contaminating oxygen (O) atoms numbered less than the minimum amount for detection.

Moreover, if the heating temperature of bisdipivaloylmethanate strontium ($Sr(C_{11}H_{19}O_2)_2$) is below 230° C., the thin-film formation speed of strontium sulfide (SrS) is slow; for example, it will take more than 7 hours to form a 700 nm thick film of strontium sulfide (SrS) within a scope of φ 100 mm and thus, the production process takes a lot more time for practical purposes. Furthermore, for this formation speed, there is a problem of impurities contaminating the thin film and after actual analysis of the components inside the strontium sulfide (SrS) thin film formed at a temperature of 230° C., excluding strontium (Sr) and sulfur (S), not only oxygen (O) was detected but also other impurities such as carbon (C) and other unidentified contaminants were also detected.

Conventionally, there has been no case where attention was given to the water content and thus, with this invention, the benefits of paying attention to such are made clear for the first time. By using the apparatus and the method of this invention, the film formation speed of SrS:Ce is greatly improved and furthermore, with lesser impurities contaminating this film, the formation of high-quality light emitting layers has become possible.

Figure 5:
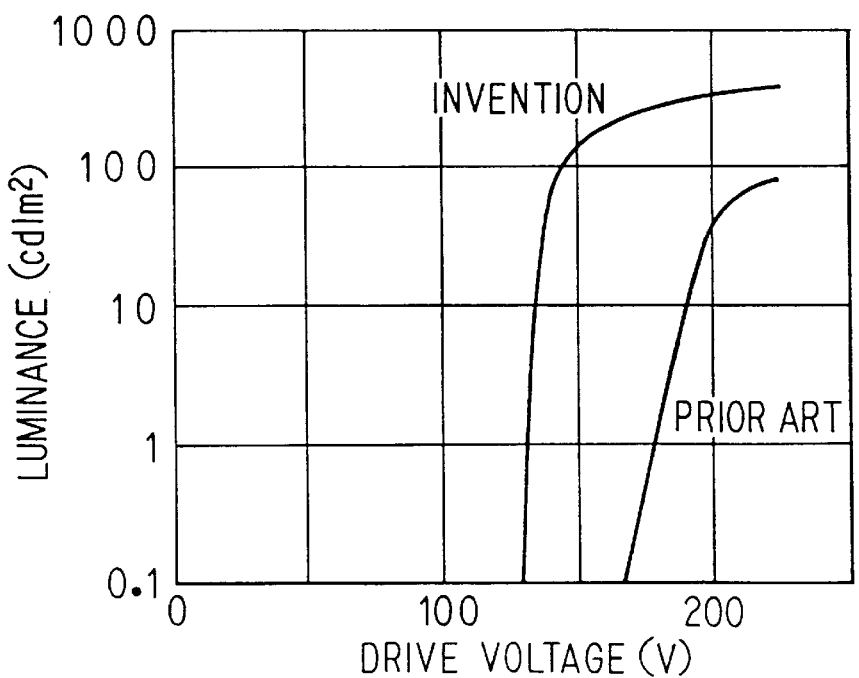
FIG. 5 is a diagram that shows the relationship of the luminosity of the EL device of the embodiment of this invention with the amount of voltage applied thereto.

FIG. 5 shows the relationship of the degree of luminance with the amount of voltage applied for the EL device manufactured using the light emitting layer formation technology described above. As for the conditions for measurement, a 60-Hz pulse-wave electric voltage was applied with the maximum voltage set at 250 V. In FIG. 5, the conventional method corresponds to the EL device having the light emitting layer that is formed from a thin film of strontium sulfide (SrS) at a growth speed when the source material gas used was sublimated at a bisdipivaloylmethanate strontium ($Sr(C_{11}H_{19}O_2)_2$) heating temperature of 230° C. and below, that is, at a low growth speed. As seen from FIG. 5, there is a great improvement in the luminance as compared to the traditional method and the threshold voltage is lowered.

In this way, for the construction of the SrS:Ce light emitting layer, it is clear that the film formation speed exerts a heavy influence on its light emission characteristics and by increasing this film formation speed through this invention, films can be formed at speeds approximately five times that of the conventional method. Therefore, the manufacturing process of the strontium sulfide (SrS) thin film is greatly shortened with commensurate, significant reductions in production costs.

While this first embodiment has been described using the SrS:Ce thin film, in other words, using the SrS:Ce film that is a binary host material, the effects of this invention is not limited to binary light emitting host materials. For example, in the MOCVD apparatus of a second embodiment, ternary host materials like $SrGa_2S_4$:Ce and the like can be formed through the addition of a supply line of a source material for a IIIB-group element host material (preferably, trimethyl gallium ($Ga(CH_3)_3$TMG)). Other suitable Group IIIB source materials are triethyl gallium, tributyl gallium, trimethyl indium, triethyl indium, tributyl indium, trimethyl aluminum, triethyl aluminum, tributyl aluminum, tribisdipivaloylmethanate gallium, tribisdipivaloylmethanate indium, and tribisdipivaloylmethanate aluminum. For these ternary host materials, for example, like those examples noted in SID 93 DIGEST, pp. 761–764, effects similar to that present in the first embodiment can also be derived by applying this invention to the EL devices that have light emitting layers composed of three elements from the II-IIIB-VIB groups.

In addition, as the VIB-group element, aside from sulfur (S), hydrides of selenium (Se) or an organic material added to selenium can also be used for the film formation and likewise, applying this invention would yield the same effects.

The use of the dehydration device involves the removal of water vapor contained inside the transport gas through physical or chemical procedures. Concrete examples of dehydration filters are commercially available devices, water traps that use liquid nitrogen, traps that use desiccants and the like; almost any dehydration device will do here as long as the dehydration device removes the water content of the transport gas and leave the characteristics of the transport gas unchanged.

What is claimed is:

1. A method of manufacturing an electroluminescent device, said method comprising the steps of:
   dehydrating a transport gas;
   transporting, using said dehydrated transport gas, a gas containing a first compound which is an organometallic compound of the IIA group which is a constituent element of light emitting host material of said electroluminescent device to provide a first source material gas, wherein said organometallic compound in said first compound is selected from the croup consisting of strontium, calcium, and barium and wherein before transport said first compound is kept at a temperature of about 210° C. to about 260° C.;

transporting a gas containing a rare earth element that functions as a light emitting center to provide a second source material gas;

introducing said first source material gas into a reactor;

introducing said second source material gas into said reactor;

introducing a gas containing a third compound including an element from the VIB group into said reactor; and reacting, in said reactor, said first compound and said second compound with said gas containing said third compound to thereby form a light emitting layer on a electroluminescent device substrate;

wherein said organometallic compound of said first compound is decomposable by water;

said dehydrating step is performed before said transport gas is mixed with said first compound to transport said first compound; and decomposition of said organometallic compound due to water in said transport gas is limited by said dehydrating step.

2. The method of claim 1, wherein said dehydrating step comprises a step of dehydrating said transport gas to provide a transport gas having a water content of not more than 100 parts per billion.

3. The method of claim 1, wherein said dehydrating step comprises a step of dehydrating said transport gas to provide a transport gas having a dew point between $-120°$ C. and $-90°$ C.

4. The method of claim 1, wherein said dehydrating step comprises a step of dehydrating said transport gas using a dehydrating filter.

5. The method of claim 1, wherein said transport gas is an inert gas, hydrogen or nitrogen.

6. The method of claim 1, wherein said third compound is one of a sulfur compound or a selenium compound.

7. The method of claim 1, further comprising a step of:

transporting a gas containing a fourth compound including an element from the IIIB group which is a constituent element of light emitting material of the electroluminescent device to said reactor;

wherein said reacting step is a step of reacting, in said reactor, said first and second compounds with said gases containing said third and fourth compounds to thereby form said light emitting layer on said electroluminescent device substrate.

8. The method of claim 1, wherein said dehydrating step is performed before said transport gas is mixed with said second compound to transport said second compound.

9. The method of claim 8, wherein said dehydrating step comprises a step of dehydrating said transport gas using a dehydrating filter.

10. The method of claim 6, wherein said second compound is an organometallic compound.

11. The method of claim 10, wherein said second compound is tribisdipivaloylmethanate cerium.

12. The method of claim 1, wherein said organometallic compound of said first compound is selected from the group consisting of bisdipivaloylmethanate strontium and bisdipivaloylmethanate calcium.

13. The method of claim 1, wherein before transport said first compound is kept at a temperature of about 230° C. to about 255° C.

14. The method of claim 1, further comprising the steps of:

filling a container with a compound of the IIA group prior to transporting;

maintaining the temperature of between 210° C. to about 260° C. in the container; and guiding the dehydrated transport gas into the container to transport the source material gas into the reactor.

* * * * *